United States Patent
Ng et al.

(10) Patent No.: US 9,807,287 B2
(45) Date of Patent: *Oct. 31, 2017

(54) VARIABLE IMAGING ARRANGEMENTS AND METHODS THEREFOR

(71) Applicant: THE BOARD OF TRUSTEES OF THE LELAND STANFORD JUNIOR UNIVERSITY, Palo Alto, CA (US)

(72) Inventors: Yi-Ren Ng, Stanford, CA (US); Patrick M. Hanrahan, Portola Valley, CA (US); Mark A. Horowitz, Menlo Park, CA (US); Marc S. Levoy, Stanford, CA (US)

(73) Assignee: Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/755,720

(22) Filed: Jun. 30, 2015

(65) Prior Publication Data

US 2015/0326848 A1 Nov. 12, 2015

Related U.S. Application Data

(63) Continuation of application No. 14/219,896, filed on Mar. 19, 2014, now Pat. No. 9,100,557, which is a
(Continued)

(51) Int. Cl.
*H04N 5/225* (2006.01)
*H04N 5/217* (2011.01)
(Continued)

(52) U.S. Cl.
CPC ......... *H04N 5/2254* (2013.01); *G02B 3/0056* (2013.01); *G02B 27/0075* (2013.01);
(Continued)

(58) Field of Classification Search
CPC .............. H04N 5/2173; H04N 5/2254; H04N 5/23212; H04N 5/23232; H04N 5/23293;
(Continued)

(56) References Cited

U.S. PATENT DOCUMENTS 3,971,065 A 7/1976 Bayer
4,383,170 A 5/1983 Takagi
(Continued)

OTHER PUBLICATIONS

P. Haeberli. "A Multifocus Method for Controlling Depth of Field." GRAPHICAObscura, 1994, pp. 1-3.
(Continued)

*Primary Examiner* — Daniel M Pasiewicz
(74) *Attorney, Agent, or Firm* — Barbara B Courtney; Courtney IP Law

(57) ABSTRACT

Various approaches to imaging involve selecting directional and spatial resolution. According to an example embodiment, images are computed using an imaging arrangement to facilitate selective directional and spatial aspects of the detection and processing of light data. Light passed through a main lens is directed to photosensors via a plurality of microlenses. The separation between the microlenses and photosensors is set to facilitate directional and/or spatial resolution in recorded light data, and facilitating refocusing power and/or image resolution in images computed from the recorded light data. In one implementation, the separation is varied between zero and one focal length of the microlenses to respectively facilitate spatial and directional resolution (with increasing directional resolution, hence refocusing power, as the separation approaches one focal length).

14 Claims, 8 Drawing Sheets

Related U.S. Application Data continuation of application No. 13/542,544, filed on Jul. 5, 2012, now Pat. No. 8,717,489, which is a continuation of application No. 12/278,714, filed as application No. PCT/US2007/003346 on Feb. 6, 2007, now Pat. No. 8,248,515.

(60) Provisional application No. 60/765,903, filed on Feb. 7, 2006, provisional application No. 60/810,432, filed on Jun. 2, 2006.

(51) Int. Cl.
   *H04N 5/232* (2006.01)
   *H04N 13/02* (2006.01)
   *H01L 27/146* (2006.01)
   *G02B 3/00* (2006.01)
   *G02B 27/00* (2006.01)

(52) U.S. Cl.
   CPC ..... *H01L 27/14627* (2013.01); *H04N 5/2173* (2013.01); *H04N 5/23212* (2013.01); *H04N 5/23232* (2013.01); *H04N 5/23293* (2013.01); *H04N 13/0235* (2013.01)

(58) Field of Classification Search
   CPC .............. H04N 13/0235; G02B 3/0056; G02B 27/0075; H01L 27/14627
   See application file for complete search history.

(56) References Cited

U.S. PATENT DOCUMENTS

| | | | |
|---|---|---|---|
| 4,448,497 A | 5/1984 | Wakamiya | |
| 4,661,986 A | 4/1987 | Adelson | |
| 4,694,185 A | 9/1987 | Weiss | |
| 4,920,419 A | 4/1990 | Easterly | |
| 5,076,687 A | 12/1991 | Adelson | |
| 5,282,045 A | 1/1994 | Mimura | |
| 5,629,734 A | 5/1997 | Hamilton, Jr. | |
| 5,748,371 A | 5/1998 | Cathey | |
| 5,757,423 A | 5/1998 | Tanaka | |
| 6,023,523 A | 2/2000 | Cohen | |
| 6,028,606 A | 2/2000 | Kolb | |
| 6,097,394 A | 8/2000 | Levoy | |
| 6,201,899 B1 | 3/2001 | Bergen | |
| 6,320,979 B1 | 11/2001 | Melen | |
| 6,483,535 B1 | 11/2002 | Tamburrino | |
| 6,577,342 B1 | 6/2003 | Webster | |
| 6,842,297 B2 | 1/2005 | Dowski | |
| 6,927,922 B2 | 8/2005 | George | |
| 7,119,319 B2 | 10/2006 | Noto | |
| 7,164,446 B2 | 1/2007 | Konishi | |
| 7,167,203 B1 | 1/2007 | Yukawa | |
| 7,336,430 B2 | 2/2008 | George | |
| 7,367,537 B2 | 5/2008 | Ibe | |
| 7,623,726 B1 | 11/2009 | Georgiev | |
| 7,956,924 B2 * | 6/2011 | Georgiev | H04N 5/23212 348/315 |
| 8,248,515 B2 * | 8/2012 | Ng | G02B 3/0056 348/343 |
| 8,717,489 B2 * | 5/2014 | Ng | G02B 3/0056 348/343 |
| 9,100,557 B2 * | 8/2015 | Ng | G02B 3/0056 |
| 2002/0159030 A1 | 10/2002 | Frey | |
| 2003/0117511 A1 | 6/2003 | Belz | |
| 2003/0156077 A1 | 8/2003 | Balogh | |
| 2005/0080602 A1 | 4/2005 | Snyder | |
| 2006/0072029 A1 | 4/2006 | Miyatake | |
| 2008/0226274 A1 | 9/2008 | Spielberg | |
| 2009/0102956 A1 | 4/2009 | Georgiev | |
| 2009/0185801 A1 | 7/2009 | Georgiev | |
| 2009/0295829 A1 | 12/2009 | Georgiev | |
| 2010/0066812 A1 * | 3/2010 | Kajihara | G02B 3/0056 348/46 |

OTHER PUBLICATIONS

Paul Haeberli, "A Multifocus Method for Controlling Depth of Field," Oct. 1994, http://grafficaobscura.com/depth/index.html.

* cited by examiner

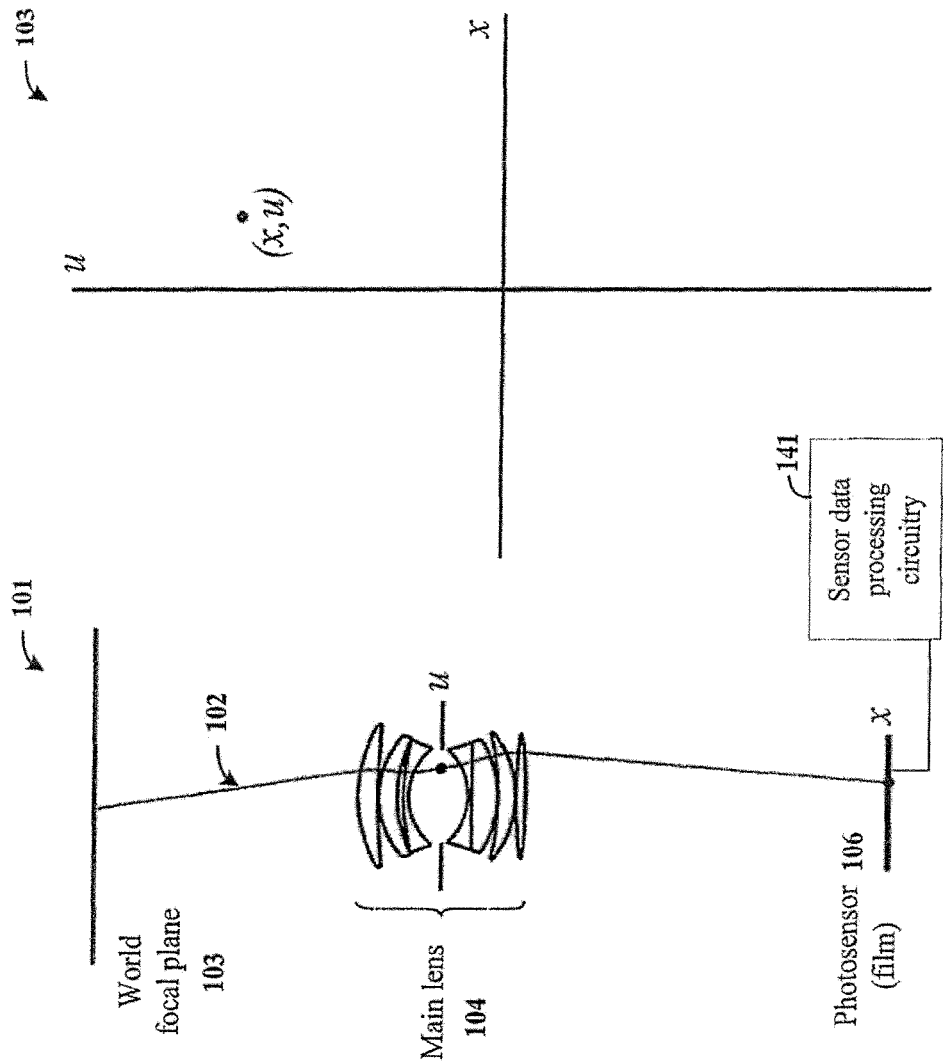

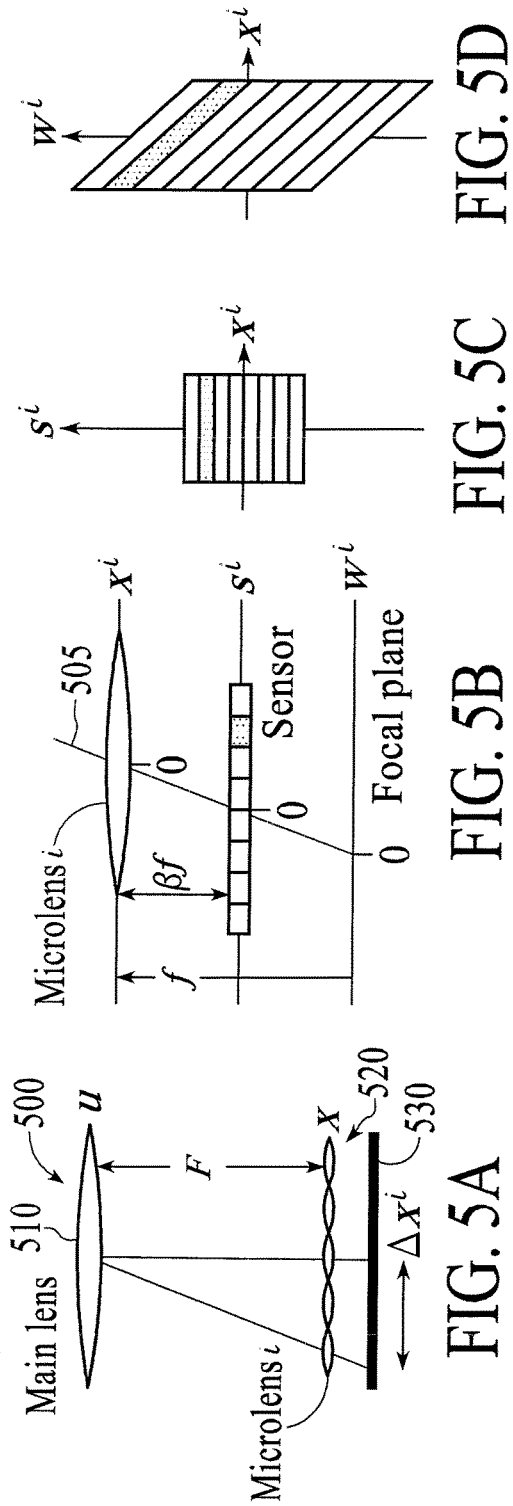
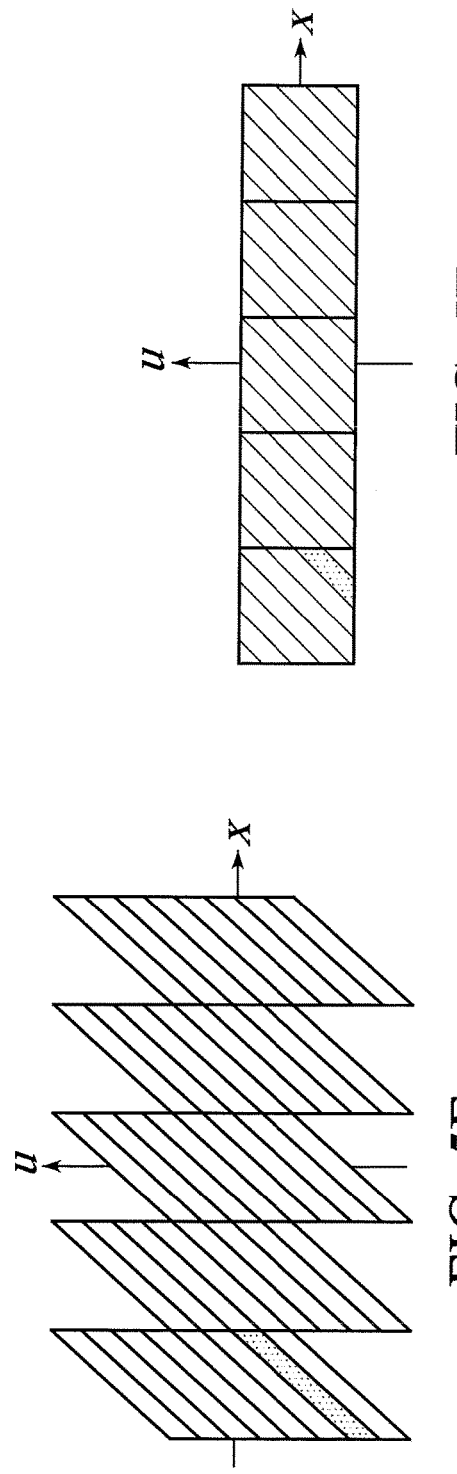
FIG. 5A  FIG. 5B  FIG. 5C  FIG. 5D  FIG. 5E  FIG. 5F

VARIABLE IMAGING ARRANGEMENTS AND METHODS THEREFOR

RELATED PATENT DOCUMENTS

This patent application is a continuation of U.S. patent application Ser. No. 14/219,896, filed filed Mar. 19, 2014. U.S. patent application Ser. No. 14/219,896 is a continuation of U.S. patent application Ser. No. 13/542,544, filed Jul. 5, 2012. Patent application Ser. No. 13/542,544 is a continuation of U.S. patent application Ser. No. 12/278,714, filed Oct. 9, 2009 (now U.S. Pat. No. 8,248,515). U.S. patent application Ser. No. 12/278,714 is a national stage filing of International Application No. PCT/US2007/003346 filed on Feb. 6, 2007, and claims the benefit, under 35 U.S.C. §119(e), of U.S. Provisional Patent Application No. 60/765,903, entitled "Imaging Arrangements and Methods Therefor" and filed on Feb. 7, 2006; this patent document also claims the benefit, under 35 U.S.C. §119(e), of U.S. Provisional Patent Application No. 60/810,432, entitled "Digital Light Field Photography" and filed on Jun. 2, 2006. This patent document is also a continuation-in-part of PCT Patent Application No. PCT/US2005/035189 (publication number WO/2006/039486), entitled "Imaging Arrangements and Methods Therefor" and filed on Sep. 30, 2005, to which priority is claimed under 35 U.S.C. §120 for common subject matter. All of the aforementioned patent applications are hereby incorporated by reference in their entirety.

FEDERALLY-SPONSORED RESEARCH AND DEVELOPMENT

This invention was made with Government support under contract 0085864 awarded by National Science Foundation. The Government has certain rights in this invention.

FIELD OF THE INVENTION

The present invention relates generally to imaging applications, and more specifically to an arrangement and approach to facilitate light field imaging which accounts for spatial and directional resolution.

BACKGROUND

Imaging applications such as those involving cameras, video cameras, microscopes and telescopes have generally been limited in their ability to collect light and to process light to generate images having significant depth of field. For example, most imaging devices do not record most of the information about the distribution of light entering the device, and are limited in their ability to generate focused images with a significant depth of field. Conventional cameras such as digital still cameras and video cameras do not record most of the information about the light distribution entering from the world. In these devices, collected light is often not amenable to manipulation for a variety of approaches, such as for focusing at different depths (distances from the imaging device), correcting for lens aberrations or manipulating the viewing position.

The general inability to generate images with significant depth of field applies to both still and video imaging applications. For still-imaging applications, typical imaging devices capturing a particular scene generally focus upon a subject or object in the scene, with other parts of the scene left out of focus. Similar problems prevail for video-imaging applications, with a collection of images used in video applications failing to capture scenes in focus.

One general approach to solving this problem has been the development of integrated light field cameras, which detect the light traveling each ray flowing inside the body of a conventional camera (the "light field" flowing inside the camera body). For example, the plenoptic camera utilizes a microlens array in front of the sensor in order to capture not just how much light accumulates at each spatial location on the imaging plane, but how much light arrives from each direction. Processing the recorded light rays in different ways allows, for example, computational refocusing of final photographs, or computational extension of the depth of field.

As many imaging applications suffer from aberrations with equipment (e.g., lenses) used to collect light, correcting for these aberrations is desirable and often necessary to generate high quality images. Such aberrations may include, for example, spherical aberration, chromatic aberration, distortion, curvature of the light field, oblique astigmatism and coma. Correction for aberrations has historically involved the use of corrective optics that tend to add bulk, expense and weight to imaging devices. In some applications benefiting from small-scale optics, such as camera phones and security cameras, the physical limitations associated with the applications make it undesirable to include additional optics. Moreover, as the number of photosensors used to collect image data increases, and as the arrangement and processing of data from the same becomes increasingly important, aberration and other conditions that raise issue with the creation of images can significantly hinder the ability to create accurate images. Aberrations can particularly inhibit the ability to create accurate images focused at different depths.

Difficulties associated with the above have presented challenges to imaging applications, including those involving the collection and processing of digital light data for digital imaging.

SUMMARY

The present invention is directed to overcoming the above-mentioned challenges and others related to imaging devices and their implementations. The present invention is exemplified in a number of implementations and applications, some of which are summarized below.

According to an example embodiment of the present invention, the relative positioning of photosensors in an imaging arrangement is varied to facilitate a desired trade-off between the spatial and angular resolution of the recorded light data. The recorded light data is used in conjunction with information characterizing the imaging arrangement (including optical design and configuration of the photosensors) in order to generate a virtual image in which a portion of the image has been refocused and/or had its image quality corrected. For example, the image quality may have been corrected by computationally reducing the effect of optical aberrations due to the optics in the recording device.

According to an example embodiment of the present invention, the relative positioning of photosensors in an imaging arrangement is varied to facilitate the selective plenoptic collection of image data. Light is detected and used together with directional information characterizing the detected light, information characterizing the imaging arrangement and the relative positioning of the photosensors to generate a virtual image that corresponds to a refocused image and, in some instances, an image that is also corrected.

According to another example embodiment of the present invention, a digital imaging system processes data useful to synthesize an image of a scene. The system includes a photosensor array, and an optics arrangement including a main lens and a microlens array at a two-dimensional focal plane of the main lens. The optics arrangement directs light from the scene to the photosensor array via the main lens and microlens array to the photosensor array. A control arrangement sets a relative spatial relationship between the photosensor array and the microlens array, typically altering their separation while keeping them parallel. For each relative positioning of the photosensor array and the microlens, each photosensor senses a different set of rays flowing within the recording device. This set of rays is a function of the position of the photosensor array relative to the microlens array, and is used in order to interpret the photosensor values in subsequent processing. A processor provides image data characterizing a synthesized image as a function of the light sensed at different photosensors, the position of the photosensors relative to the microlens array, and the optical configuration of the microlenses and the rest of the optical train in the recording device.

According to another example embodiment of the present invention, a digital imaging system synthesizes an image from a set of light rays. The system includes a main lens, a photosensor array to collect a set of light rays and to output light data characterizing the set of light rays, and a microlens array, between the main lens and the photosensor array, to direct the set of light rays from the main lens to the photosensor array. A positioning arrangement sets a relative separation between the photosensor array and microlens array to facilitate selective detection of directional characteristics of the light ray data recorded by the photosensor array. In a more particular embodiment, this selectivity is achieved via a selectable trade-off between the spatial and directional resolution of the recorded light ray data. An image data processor computes a synthesized refocused image, using the light ray data, as a function of the optical properties, physical arrangement and relative position of the main lens, microlens array and photosensor array. The synthesized refocused image exhibits a virtual redirection of the set of light rays as collected by the photosensor array.

According to another example embodiment of the present invention, a camera having a main lens, a microlens array and a photosensor array is used for digital imaging. The photosensor array is arranged to sense light passed via the main lens to the microlens array and dispersed by the microlens array. The configuration of the camera is set by setting the separation between the planes in which the microlens array and photosensor array lie. The microlens array is used to direct light to the photosensor array, with the photosensor array including, for each microlens in the microlens array, a plurality of photosensors arranged to receive light from the microlens. The photosensor array is used to sample the light field flowing within the camera, and the light field is computationally resampled as a function of a ray-tracing approach for determining where the light rays passing into the camera will terminate on the photosensor array. The digitally resampled light field is used to compute an output image in which at least a portion of the image is refocused.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which:

FIGS. 1C and 1D show an approach to characterizing detected light rays to facilitate the computation of an image, such as with the arrangement in FIG. 1A, according to another example embodiment of the present invention;

FIGS. 2A-4B show an arrangement for sampling light fields for computing images, with varied microlens-to-photosensor distance in accordance with various embodiments of the present invention, wherein FIGS. 2A-B show a relatively large microlens-to-photosensor distance, FIGS. 4A-B show a relatively small (e.g., near-zero) microlens-to-photosensor distance;

FIGS. 5A-5F show an approach to computing an image to facilitate different microlens-to-photosensor distances, according to another example embodiment of the present invention.

Figure 1A:
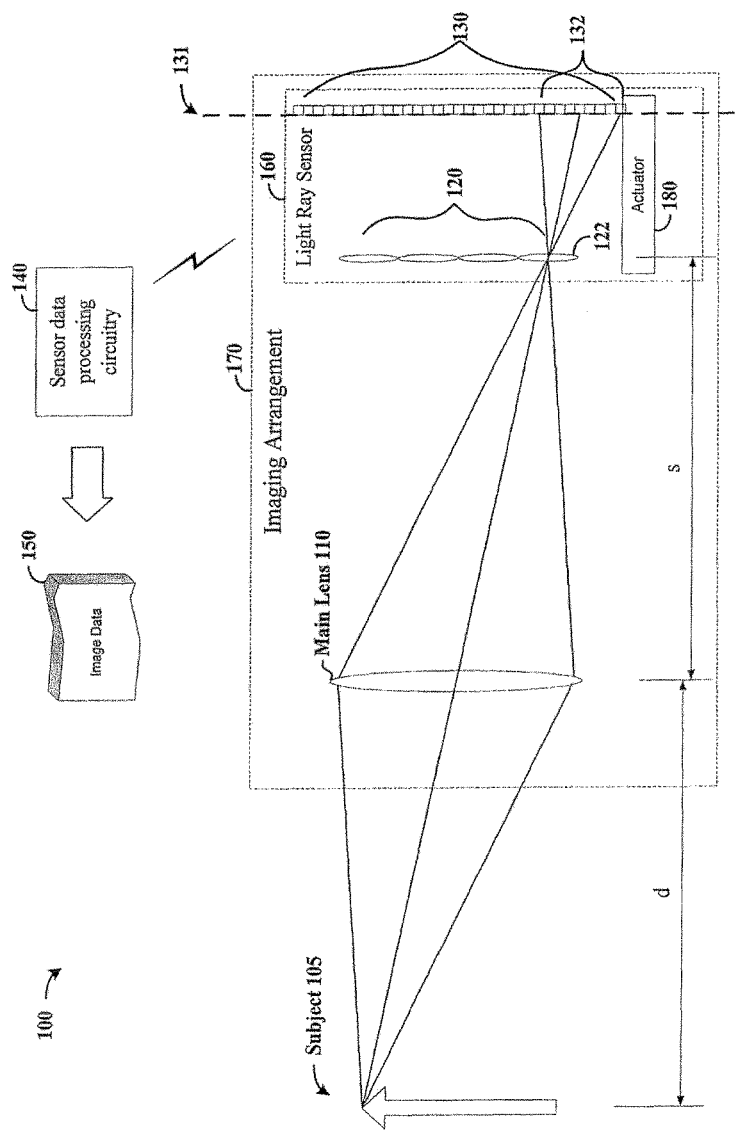
FIG. 1A is an imaging arrangement for sampling a light field flowing past a lens, for computing images with refocusing and/or image correction, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention

DETAILED DESCRIPTION

The present invention is believed to be useful for a variety of imaging applications, and the invention has been found to be particularly suited for electronic imaging devices and applications involving light field sampling and the correction of related images. In these contexts, a "light field" refers to the 4D function that defines the amount of light (e.g., radiance) traveling along each ray in some region of space. In the embodiments discussed below the region of space is typically the interior of the recording optical device, such as the space within the body of a camera, microscope, telescope, etc. In connection with various embodiments described below, primary interest is directed to the rays of light flowing into an imaging plane, such as the focal plane typically defined by the photosensor array in a conventional digital camera. With respect to this imaging plane, "spatial resolution" refers to the sampling density within the 2D imaging plane itself and "directional resolution" refers to the sampling density in the 2D angular domain of rays incident on the imaging plane. While the present invention is not necessarily limited to such applications, aspects of the invention may be appreciated through a discussion of various examples using these contexts.

According to an example embodiment, an imaging arrangement is adapted to select a desired spatial and directional resolution in recorded light field data to facilitate different performance characteristics in images computed from the detected light. In some applications, the imaging arrangement facilitates greater directional functionality, with a main lens passing light through microlenses that are focused on the main lens, to photosensors at or near the focal plane of the microlenses. In other applications, the aforesaid imaging arrangement controls the positioning of the photosensors to facilitate greater spatial resolution and less directional resolution by positioning the photosensors closer to the microlenses (physically and/or optically), relative to the microlenses' focal plane. In still other applications, the imaging arrangement positions the photosensors immediately adjacent to the microlenses to facilitate maximum spatial resolution. Characteristics of the optical arrangement, including the separation of the microlenses and photosensors, are used with light ray data from the photosensors to compute an image that is refocused and/or exhibits image enhancements such as aberration correction.

Turning now to the Figures, FIG. 1A shows an imaging system 100 that facilitates the collection of light and computation of an image using a selectable photosensor positioning approach to set spatial and directional resolution, according to another example embodiment of the present invention. The imaging system 100 includes an imaging arrangement 170 having a main lens 110, a microlens array 120, a photosensor array 130 and an actuator 180 for setting the distance between the microlens and photosensor arrays. In the context of examples herein, the microlens array 120 and photosensor array 130 may be referred to as implementing a light ray sensor. Although FIG. 1A illustrates a particular main lens 110 (single element) and particular microlens array 120, those skilled in the art will recognize that a variety of lenses and/or microlens arrays (currently available or developed in the future) are selectively implemented with a similar approach by, for example, replacing the shown main lens and/or microlens array. For instance, the main lens arrangement 210 in FIG. 2A may be implemented as main lens 110, in connection with various embodiments.

For illustrative purposes, rays of light from a point on a subject 105 in an imaged scene are brought to a convergence point on the microlens array 120, which is located at the optical conjugate distance of the subject. For this example, the photosensor array 130 is shown located at the focal plane 131, with the actuator 180 selectively moving the photosensor array 130 between the shown position and positions closer to the microlens array 120. However, the photosensor array 130 may be located at various separations from the microlens array to provide different sampling patterns of the light field. The typical separation range is between the shown location (at the focal length of the microlens array 120) and immediately adjacent the microlens array 120 (i.e., from zero to one focal length of separation). A microlens 122 at this convergence point separates these rays of light based on the direction of the light. In configurations where the separation between the microlens array and photosensor array is equal to the focal length of the microlenses, the microlens 122 creates a focused image of the aperture of the main lens 110 on the photosensors (positioned as shown) underneath the microlens. Where oriented laterally as shown, "underneath" refers to a position that is optically beyond the microlens, relative to the main lens. Other positions of the photosensor array 130 may involve a positioning similar, for example, to those shown in connection with FIG. 2A, FIG. 3A and FIG. 4A and discussed further below.

Each photosensor in the photosensor array 130 detects light incident upon it and generates an output that is processed using one or more of a variety of components. The output light ray data are passed to sensor data processing circuitry 140, which uses the data together with positional information indicating the location of the photosensor array 130 relative to the microlens array 120, as well as selective use of the optical configuration of the remainder of the imaging arrangement 170, to compute image data 150 of a scene (e.g., including subject 105).

The sensor data processing circuitry 140 is implemented, for example, with a computer or other processing circuit selectively implemented in a common component (e.g., a chip) or in different components. In various specific embodiments also according to the present invention, the input to the sensor data processing circuitry 140 includes the detected light ray values and the geometrical and optical configuration of the imaging arrangement 170. From these inputs, the sensor data processing circuitry 140 computes output imagery selectively exhibiting a refocused image and, where appropriate, a corrected image (where refocusing may include correcting). Various approaches to processing detected light data are described in detail herein, including those approaches described above, with and without reference to other figures. These approaches may be selectively implemented with an approach similar to that described with the sensor data processing circuitry 140.

FIGS. 1C and 1D show an approach to characterizing the light field sampling pattern to facilitate the computation of an image, such as with the arrangement in FIG. 1A, according to other example embodiments of the present invention. FIGS. 1C and 1D) and the following description may also be applied in connection with other approaches described herein, including those described with FIGS. 2A-4B below. Generally, FIG. 1C shows an optical imaging arrangement 101, similar to that shown in FIG. 1A, with a main lens and photosensor arranged to detect light from a world focal plane and to pass light data to sensor processing circuitry 141 (similar to circuitry 140 in FIG. 1A) that is adapted to compute a refocused image using a Cartesian approach.

For illustration, a single ray 102 is characterized as passing through a point "u" at the main lens 104 to a point "x" on the photosensor (imaging plane) 106. Of course in general the ray exists in three dimensions and we would consider intersections (u, v) at the lens and (x, y) on the imaging plane. Let us refer to the value of the light field along the depicted ray as L(x, y, u, v), or L(x, u) if we are considering the two-dimensional simplification.

FIG. 1D shows a Cartesian ray-space plot 103 as an abstract representation of the two-dimensional light field, and is used in computing an image at the sensor processing circuitry 141. The ray depicted on the left is shown as a point (x, u) on the Cartesian ray-space in plot 103. In general, each possible ray in FIG. 1C corresponds to a different point on the ray-space diagram on FIG. 1D. This example approach to depicting the position related to light data is used in computing an image with various example embodiments below.

Returning to FIG. 1A, as discussed above, the position of the photosensor array 130 is set, relative to the microlens array 120, to facilitate certain imaging approaches. As the photosensor array 130 is moved from the focal plane 131 towards the microlens array 120, the images under each microlens (referred to as "microlens images") become defocused. Each level of defocus provides a different light field sampling pattern, and these have different performance trade-offs (e.g., between spatial and directional resolution). As shown in FIG. 1A, the photosensor array 130 is located at approximately the focal plane of the microlens array 120, such that the microlens images are focused on the main lens. This configuration provides a relative maximal directional "u" resolution and relative minimal "x" spatial resolution on the ray-space of the recorded light field.

When the photosensor array 130 is moved to a position between the focal plane 131 and the microlens array 120, horizontal lines in the ray-space sampling pattern tilt, thereby becoming more concentrated vertically and less so horizontally. This effect can be intuitively understood in terms of the shearing of the light field when focusing at different depths. For illustrative purposes, the focus change can be considered to take place in a microscopic camera composed of each microlens and its patch of pixels, and the shearing takes place in the microscopic light field inside this microlens camera.

When the photosensor array 130 is located at close to zero separation (i.e., essentially against the microlens array), the imaging system 100 performs similarly to a conventional camera. The corresponding ray-space sampling converges to a pattern of vertical columns as the separation between microlenses and photosensor approaches zero. In this case the microlenses are almost completely defocused, with a relative minimal directional resolution and a relative maximal spatial resolution. That is, the values read off the photosensor array 130 for such a zero separation approach the values that would appear in a conventional camera in the absence of the microlens array 120.

In various embodiments, different portions of the imaging system 100 are selectively implemented in a common or separate physical arrangement, depending upon the particular application. For example, when implemented with certain applications, the microlens array 120, photosensor array 130 and actuator 180 are combined into a common image sensor arrangement 160. In some applications, the microlens array 120, photosensor array 130 and actuator 180 are coupled together on a common chip or other circuit arrangement. When implemented with a hand-held device such as a camera-like device, the main lens 110, microlens array 120, photosensor array 130 and actuator 180 are selectively combined into a common imaging arrangement 170 integrated with the handheld device. Furthermore, certain applications involve the implementation of some or all of the sensor data processing circuitry 140 in a common circuit arrangement with the photosensor array 130 (e.g., on a common chip).

The microlens array 120 and photosensor array 130 are representatively shown from a two-dimensional perspective with relatively few microlenses and photosensors, but are readily implemented with varied arrangements of microlenses and photosensors. For instance, the microlens array 120 is generally implemented with a multitude (e.g., thousands or millions) of microlenses. The photosensor array 130 generally includes a relatively finer pitch than the microlens array 120, with a plurality of photosensors for each microlens in the microlens array 120. In addition, the f-numbers of the microlenses in the microlens array 120 and the f-number of the main lens 110 are generally set such that light passing via each microlens to the photosensor array does not significantly overlap light passed via adjacent microlenses. In some embodiments, this condition is achieved by setting the f-number of the lens to be equal or higher than the f-number of the microlenses.

The actuator 180 is represented generally, with a variety of actuation approaches readily implemented for moving the photosensor array 130. For example, actuators used in conventional cameras to position optics may be used in a similar manner to position the photosensor array 130. For example, the approaches shown in one or more of U.S. Pat. Nos. 7,167,203 and 7,164,446 may be implemented for positioning the photosensor array in connection with various example embodiments.

In various applications, the main lens 110 is translated along its optical axis (as shown in FIG. 1A, in a horizontal direction) to focus on a subject of interest at a desired depth "d" as exemplified between the main lens and an example imaging subject 105. By way of example, light rays from a point on the subject 105 are shown for purposes of this discussion. These light rays are brought to a convergence point at microlens 122 on the focal plane of the microlens array 120. The microlens 122 separates these rays of light based on direction, creating a focused image of the aperture of the main lens 110 on a set of pixels 132 in the array of pixels underneath the microlens.

Figure 1B:
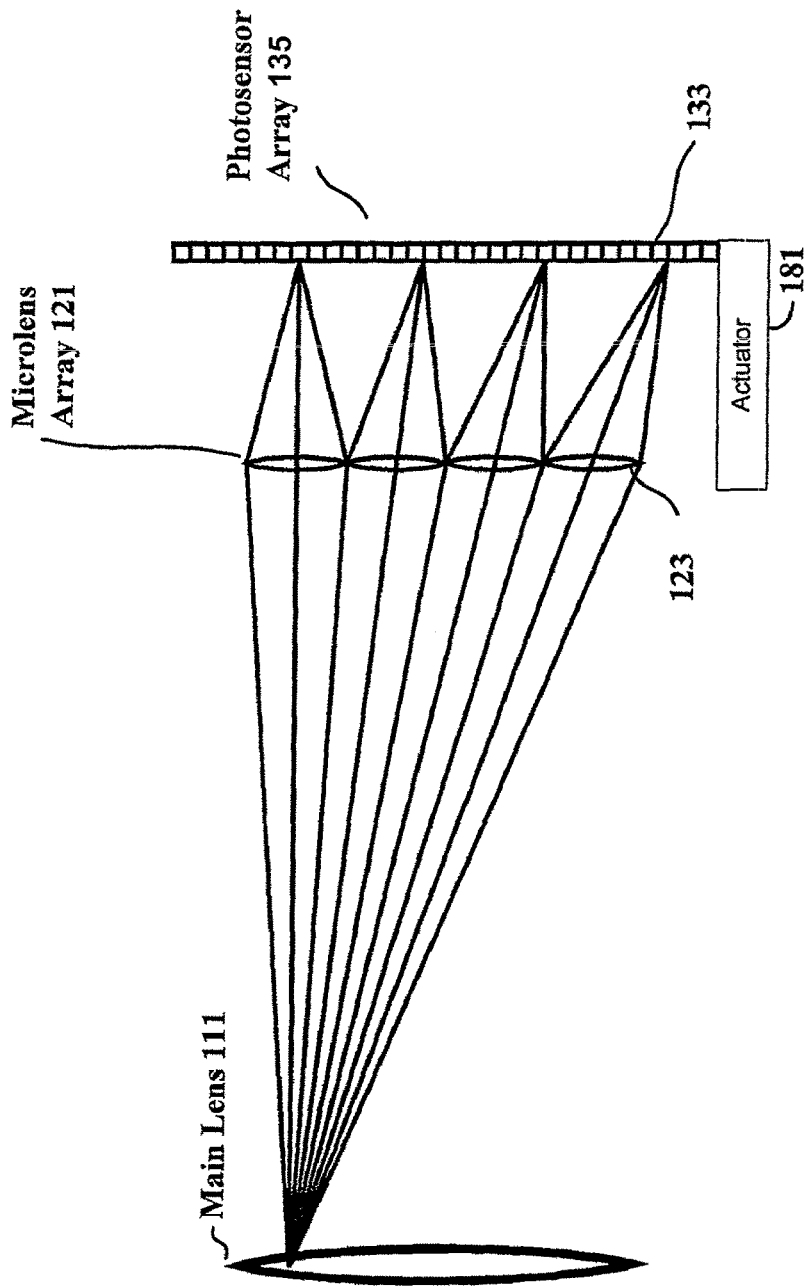
FIG. 1B illustrates a different set of rays within the imaging arrangement of FIG. 1A, according to another example embodiment of the present invention.

FIG. 1B illustrates an example approach to separating light rays, such that all rays emanating from a point on a main lens 110 and arriving anywhere on the surface of the same microlens (e.g., 123) are directed by that microlens to converge at the same point on a photosensor (e.g., 133). This approach shown in FIG. 1B may, for example, be implemented in connection with FIG. 1A (i.e., with the main lens 111 implemented for main lens 110, with microlens array 121 implemented for microlens array 120, with photosensor array 131 implemented for photosensor array 135 and with the actuator 181 implemented for actuator 180).

The image that forms under a particular microlens in the microlens array 121 dictates the directional resolution of the system for that location on the imaging plane. In some applications, directional resolution is enhanced by facilitating sharp microlens images, with the microlenses focused on the principal plane of the main lens. In certain applications, the microlenses are at least two orders of magnitude smaller than the separation between the microlens array and the main lens 111. In these applications, the main lens 111 is effectively at the microlenses' optical infinity; to focus the microlenses, the photosensor array 135 is located in a plane at the microlenses' focal plane. To facilitate increased spatial resolution, the photosensor array 135 is positioned closer to the microlens array 121.

The microlens array 120 is implemented using one or more of a variety of microlenses and arrangements thereof. In one example embodiment, a plane of microlenses with potentially spatially varying properties is implemented as the microlens array 120. For example, the microlens array may include lenses that are homogeneous and/or inhomogeneous, square in extent or non-square in extent, regularly distributed or non-regularly distributed, and in a pattern than is repeating or non-repeating, with portions that are optionally masked. The microlenses themselves may be convex, non-convex, or have an arbitrary profile to effect a desired physical direction of light, and may vary in profile from microlens to microlenses on the plane. Various distributions and lens profiles are selectively combined. These various embodiments provide sampling patterns that are higher spatially (correspondingly lower angularly) in some regions of the array, and higher angularly (correspondingly lower spatially) in other regions. One use of such data facilitates interpolation to match desired spatial and angular resolution in the 4D space.

Figure 2A:
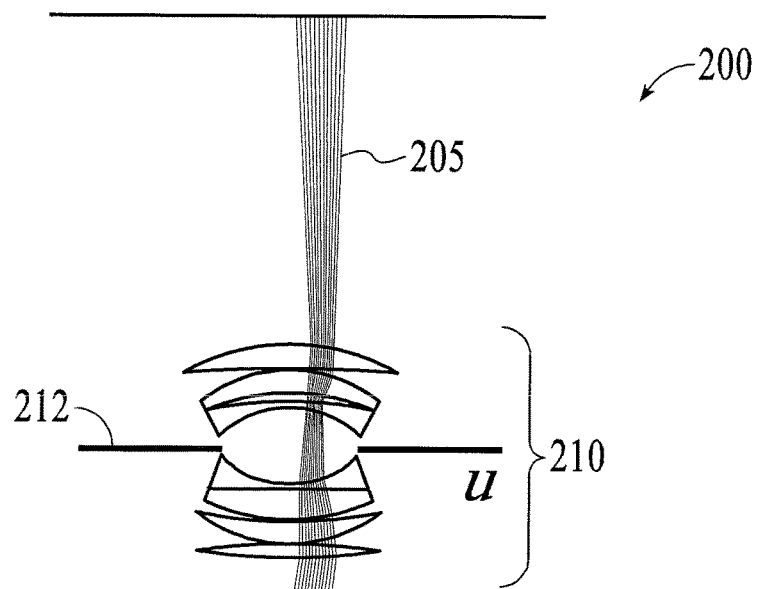

FIGS. 2A-4B show an arrangement for detecting light for computing images, each set of figures (i.e., FIGS. 2A&B; FIGS. 3A&B; and FIGS. 4A&B) depicting different microlens-to-photosensor distances, as implemented in accordance with various example embodiments. In each of FIGS. 2A, 3A and 4A, the imaging arrangement 200 may be implemented in a camera, microscope or other imaging device, such as that shown in FIG. 1A and discussed above. That is, the indicated main lenses, microlens arrays, photosensor arrays and actuators are arranged together and controlled to detect light ray data for processing locally and/or remotely. The shown rays are those that are integrated by the same photosensor pixel with different microlens focus for each position of the photosensor array. The following more particularly describes each figure relative to its indicated microlens-to-photosensor array separation.

Figure 2B:
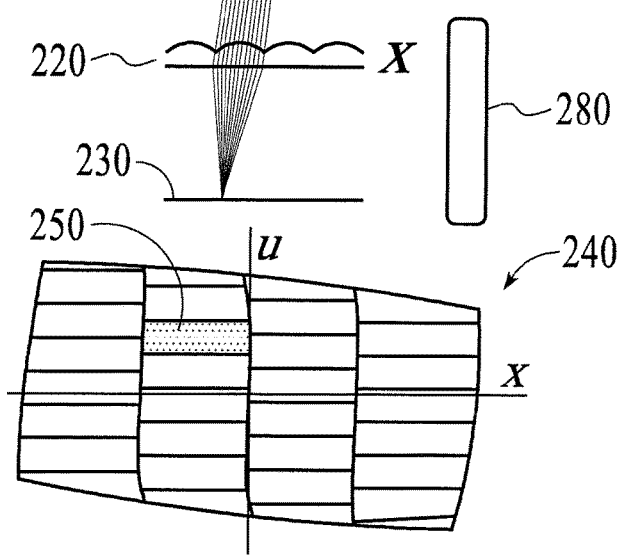

Beginning with FIG. 2A, an imaging arrangement 200 includes a main lens arrangement 210 with aperture 212, a microlens array 220 and a photosensor array 230 that is positioned using an actuator 280 (i.e., to translate the photosensor array vertically, relative to the positioning shown in FIG. 2A). The actuator 280 has positioned the photosensor array 230 at a location relative to the microlens array 220 that is close to or at the focal length of the individual microlenses in the microlens array, with the microlenses focused on the main lens 210. This arrangement facilitates a recorded sampling of the light field with relatively high directional resolution. By way of example, a set of rays 205 is shown in FIG. 2A, and FIG. 2B shows a sampling pattern 240 with the set of rays integrated by a photosensor pixel 250.

Figure 3A:
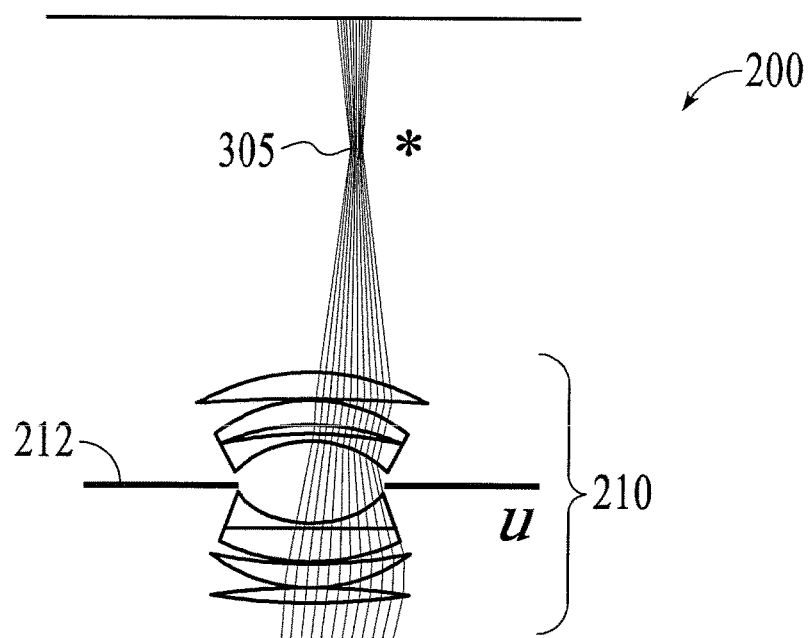
FIGS. 3A-B show an intermediate microlens-to-photosensor distance.
Figure 3B:
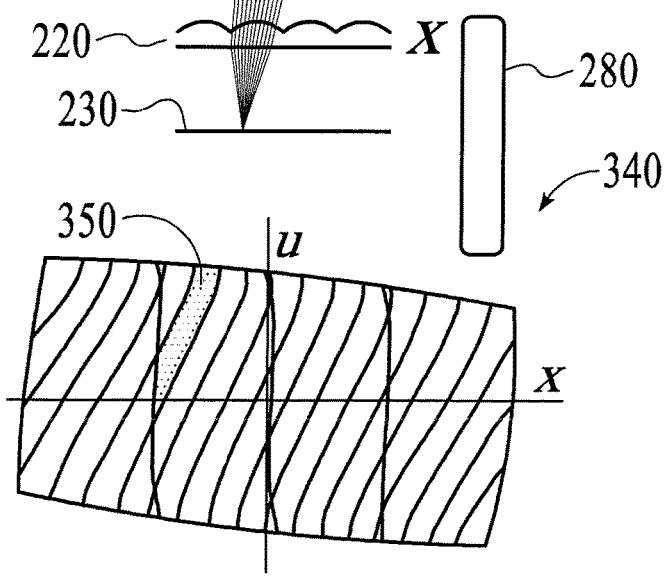

FIG. 3A shows the imaging arrangement 200 with the photosensor array 230 positioned by the actuator 280 at an intermediate microlens-to-photosensor separation, less than the focal length of the microlenses in the microlens array 220. With this positioning and as relative to FIG. 2A, the light field is detected with greater spatial resolution and less directional resolution. A set of rays 305 is shown by way of example in FIG. 3A, and FIG. 3B shows a sampling pattern 340 with the set of rays integrated by a photosensor pixel 350. The horizontal lines in the sampling pattern 340 are slanted, relative to those shown in FIG. 2B, with more vertical and less horizontal concentration.

Figure 4A:
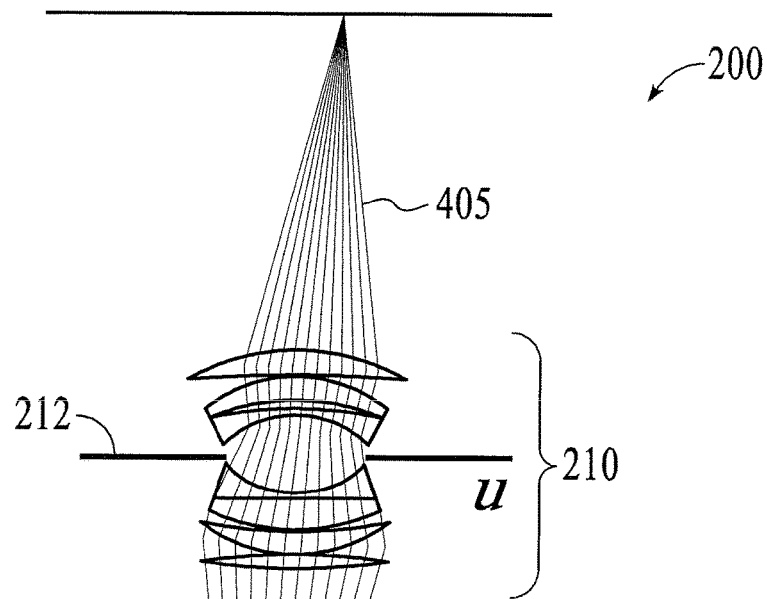
Figure 4B:
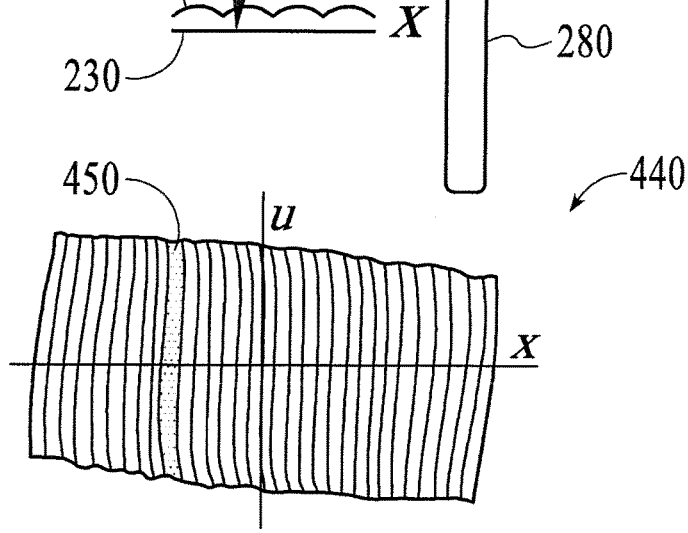

FIG. 4A shows the imaging arrangement 200 with the photosensor array 230 positioned by the actuator 280 at a relatively small (e.g., near-zero) microlens-to-photosensor distance, such that the microlenses in the microlens array 220 are almost completely defocused. This positioning facilitates a light field sampling with most if not all of the spatial resolution of the photosensor array 230; however, little to no directional information is obtained. A set of rays 405 is shown by example in FIG. 4A, with a corresponding sampling pattern 440 in FIG. 4B with the set of rays integrated by a photosensor pixel 450.

With the above discussion and corresponding figures in mind, the following describes various example embodiments directed to imaging with selective directional resolution as controlled via microlens-to-photosensor separation. In certain examples, reference is made to one or more of the above-discussed figures.

Considering the separation between the microlens array 120 and the photosensor array 130 in FIG. 1A, each separation of the microlens array and photosensor is effectively a different configuration of a generalized light field camera. By way of example, define $\beta$ to be the separation as a fraction of the depth that causes the microlenses in the microlens array 120 to be focused on the main lens 110. For example, a plenoptic camera configuration corresponds to $\beta=1$ (e.g., with the microlens and photosensor arrays 120 and 130 separated by the focal length of the microlenses), and a configuration involving the microlens and photosensor array pressed up against one another corresponds to $\beta=0$. As described above, decreasing the $\beta$ value defocuses the microlenses by focusing them beyond the aperture of the main lens 110.

Referring to FIGS. 2A, 3A and 4A, the respective sets of rays 205, 305 and 405 respectively reflect an increase in spatial resolution at the expense of directional resolution as the separation $\beta$ approaches zero. Reducing the $\beta$ value results in a shearing of the light field sampling pattern within each column, resulting in an increase in effective spatial resolution (reduction in x extent), and a corresponding decrease in directional resolution (increase in u extent).

In some applications, higher image resolution is obtained by reducing the separation between the microlenses and photosensors (by reducing the $\beta$ value) respectively in the microlens and photosensor arrays 120 and 130, and by changing the optical focus of the main lens 110 and final image processing (e.g., via sensor data processing circuitry 140). For instance, at $\beta=0$, the microlenses are pressed up against the sensor and lose their optical power; thus the effective spatial resolution is that of the sensor. The effective resolution decreases linearly to zero as the $\beta$ value increases, with the resolution of the microlens array 120 setting a lower bound. In equations, if the resolution of the photosensor array is $M_{sensor} \times M_{sensor}$ (where the photosensor array 130 has M×M photosensors) and the resolution of the microlens array is $M_{lenslets} \times M_{lenslets}$ (where the microlens array 120 has M×M microlenses) the output images have an effective resolution $M_{effective} \times M_{effective}$, where $$M_{effective} = \max((1-\beta)M_{sensor}, M_{lenslets}). \qquad \text{Equation 1}$$

Changes in the sampling pattern of a generalized light field camera implemented in accordance with FIGS. 2A-4D are localized within columns defined by the microlens array. Each column represents the microscopic ray-space between one microlens and the patch of photosensors that it covers. Defocusing the microlens by reducing the $\beta$ value shears the microscopic ray-space. The example derivation described below in connection with FIGS. 5A-5E describes an approach to calculating the sampling pattern of the light field as a function of $\beta$, for use in connection with one or more example embodiments of the present invention. The derivation begins with the microscopic ray-spaces between each microlens and photosensor, where the sampling pattern is trivial, moving out into the ray-space of a full camera.

FIG. 5A is a schematic for a light field camera 500 having a main lens 510, microlens array 520 and photosensor array 530, showing a microlens labeled i whose microscopic light field is to be analyzed further. FIG. 5B illustrates a close-up of the microlens i, with its own local coordinate system, and a portion of the photosensor array 530 located under the microlens. The microscopic light field's ray-space is parameterized by the intersection of rays with the three illustrated planes: the microlens plane, $x^i$, the sensor plane, $s^i$, and the focal plane of the microlens, $w^i$. In order to map this microscopic ray-space neatly into a column of the macroscopic ray-space for the whole camera, the origins of the three planes are chosen to lie along the line 505 passing through the center of the main lens 510 and the center of microlens i, as indicated on FIGS. 5A and 5B. The focal length of the microlenses is f, and the separation between the microlens array 520 and the photosensor array 530 is βf, using the above characterization of β.

FIG. 5C illustrates the shape of an example sampling pattern on the ray-space parameterized by the microlens $x^i$ plane and the photosensor $s^i$ plane. This choice of ray-space parameterization shows that the sampling is given by a rectilinear grid, since each photosensor pixel integrates all the rays passing through its extent on $s^i$, and the entire surface of the microlens on $x^i$. Let us denote the microscopic light field as $l^i_{\beta f}(x^i, w^i)$ where the subscript βf refers to the separation between the parameterization planes. The sampling pattern in this ray-space is transformed into the macroscopic ray-space, using a change in coordinate systems.

FIG. 5D illustrates a first transformation: re-parameterizing $l^i_{\beta f}$ by changing the lower parameterization plane from the sensor plane $s^i$ to the microlens focal plane $w^i$. The microscopic light field parameterized by $x^i$ and $w^i$ is denoted as $l^i_f(x^i, w^i)$ where the f subscript reflects the increased separation of one microlens focal length. Reparameterizing into this space introduces shear in the light field, with the following characterization:

$$l^i_{\beta f}(x^i, s^i) = l^i_f\left(x^i, x^i\left(1 - \frac{1}{\beta}\right) + \frac{s^i}{\beta}\right) \quad \text{Equation 2}$$

The transformation from the microscopic light fields under each microlens into the macroscopic ray-space of the camera involves two steps. First, there is a horizontal shift of $\Delta x^i$, as shown on FIG. 5A, to align their origins. The second step is an inversion and scaling in the vertical axis. Since the focal plane of the microlens i is optically focused on the main lens 510, every ray that passes through a given point on $l^i_f$ passes through the same, conjugate point on the u. The location of this conjugate point is opposite in sign due to optical inversion (the image of the main lens appears upside down under the microlens). It is also scaled by a factor of F/f because of optical magnification. Combining these transformation steps, $$l^i_f(x^i, w^i) = L\left(\Delta x^i + x^i, -\frac{F}{f}w^i\right) \quad \text{Equation 3}$$

Combining Equations 2 and 3 gives the complete transformation from $l^i_{\beta f}$ the macroscopic space:

$$l^i_{\beta f}(x^i, s^i) = L\left(\Delta x^i + x^i, x^i\frac{F}{f}\left(\frac{1}{\beta} - 1\right) - \frac{F}{f}\frac{s^i}{\beta}\right) \quad \text{Equation 4}$$

Equation 4 shows that the slope of the grid cells in FIG. 5E is $$\frac{F}{f}\left(\frac{1}{\beta} - 1\right). \quad \text{Equation 5}$$

discussed further below.

The above discussion holds for the microscopic light fields under each microlens in the microlens array 520. FIG. 5E illustrates the transformation of all these microscopic light fields into the macroscopic ray space, showing how they pack together to populate the entire space. FIG. 5F illustrates that the main lens 510 truncates the sampling pattern vertically to fall within the range of u values passed by the lens aperture.

In the above description, the main lens is assumed ideal, and the f-numbers of the system are matched to prevent cross-talk between microlenses. In many applications, aberrations affect the above approach and various conditions are addressed via computational approaches similar to the above. For general information regarding imaging, and for specific information regarding lens aberration and correction therefor, reference may be made to related International (PCT) Application Serial No. PCT/US2007/003346 and corresponding PCT Publication No. WO/2007/092545, entitled "Correction of Optical Aberrations".

In connection with various example embodiments, including those discussed in connection with the figures above, the focus of a main lens is set as a condition of the separation between a corresponding microlens array and photosensor array. For instance, referring to FIG. 1A, the main lens 110 is focused relative to the distance between the microlens array 120 and the photosensor array 130 (e.g., corresponding to the distance βf as referenced in FIG. 5B).

In one implementation involving intermediate β values, a high final image resolution is obtained by optically focusing slightly beyond the subject (e.g., 105 in FIG. 1A), and use digital refocusing to pull the virtual focal plane back onto the subject of interest. For example, referring to FIG. 3A, desirable (e.g., maximal) spatial resolution of resultant photographs is achieved by digitally refocusing slightly closer than the world focal plane, which is indicated by the upper horizontal line on the ray-trace diagram (at X). The refocus plane of greatest resolution corresponds to the plane passing through the point where the convergence of world rays is most concentrated (where the reference number 305 points in FIG. 3A). Optically focusing further facilitates a shift of this concentrated position of world rays onto the focal plane. As the β value increases, this concentrated position moves closer to the main lens.

Referring again to FIGS. 5A and 5B, some embodiments use the following approach to produce (about) maximum resolution in an output refocused image generated from the generalized light field camera. In the following equations, the assumption is that the desired output photograph is focused as if a conventional photosensor were placed at a depth F from the main lens 510. In order to achieve this, the generalized light field camera's optical focus is set such that the separation between the main lens 510 and the microlens array is given by $$F_{opt} = F + \frac{\beta}{(\beta - 1)}f. \quad \text{Equation 6}$$

The maximum-resolution output image is computed by digital refocusing to compute a virtual image in which the virtual separation between the main lens 510 and imaging plane is F.

For the range of β values described with FIGS. 2A, 3A and 4A (0<β≤1), $F_{opt}$<F, meaning that the microlens plane is brought closer to the main lens to optically focus further in the world. The optical mis-focus is the difference between $F_{opt}$ and F, given by $$\frac{\beta}{(\beta-1)}f. \quad \text{Equation 7}$$

As β approaches 1, the optical mis-focus asymptotes to negative infinity, as the slope of the sampling grid cells becomes too horizontal, and the optimal resolution is dominated by the vertical columns of the sampling pattern set by the resolution of the microlens array, not by the slope of the cells within each column. When this occurs, the optical focal depth is set at the desired focal depth (i.e., $F_{opt}$=F), to provide the greatest latitude in refocusing about that center. In some applications, Equation 6 is no longer used once the effective resolution for the β configuration falls to less than twice the resolution of the microlens array.

As discussed above, the predicted effective resolution Meffective×Meffective of the output images is $$M_{effective} = \max((1-\beta)M_{sensor}, M_{lenslets}). \quad \text{(repeating Equation 1)}$$

As with $F_{opt}$, the predicted value for $M_{effective}$ derives from an analysis of the ray-space sampling pattern. Refocusing aligns the imaging projection lines with the slope of the grid cells, facilitating the extraction of higher spatial resolution in the sheared sampling pattern. With this approach, the effective resolution of the computed image is equal to the number of grid cells that intersect the x axis. Within each microscopic light field, Equation 2 shows that the number of grid cells crossed is proportional to (1−β), because of the shearing of the microscopic light field sampling patterns. Hence, the overall resolution is proportional to (1−β). The maximum possible resolution is the resolution of the sensor, and the minimum is the resolution of the microlens array.

In some embodiments, when recording light fields with intermediate β, an auto-focus sensor is used to indicate the depth of the subject. If the auto-focus sensor indicates that the subject is at depth F, the sensor is positioned at $F_{opt}$ as described above. Digital refocusing onto depth F after exposure is used to produce an image with a large (e.g., maximum) possible effective resolution of max((1−β) $M_{sensor}, M_{lenslets}$).

In connection with various embodiments discussed above involving refocusing, output images are anti-aliased by combining samples from multiple spatial locations. In this regard, images with non-zero optical mis-focus are used to produce higher-quality images (e.g., relative to images with zero mis-focus), as facilitated by positioning photosensors relative to microlenses in a mis-focused position.

The relative positioning of microlenses and photosensors is chosen to facilitate the particular application, desirable spatial resolution and directional resolution. In one embodiment, the separation between microlenses and photosensors is set to about one half of the focal length of the microlenses to facilitate spatial resolution with all but about 2×2 of the full photosensor resolution. For intermediate separations, the spatial resolution varies continuously between the resolution of the microlens array and that of the photosensor. The refocusing power decreases roughly in proportion to the increase in spatial resolution, and in some instances, any loss in directional resolution as the separation between microlenses and photosensors is reduced is well contained within a factor of 2 of an ideal instance.

In one embodiment, a generalized light field camera is adapted for selective variation between a conventional camera with high spatial resolution, and a plenoptic camera with more moderate spatial resolution but greater directional resolution and hence refocusing power. A mechanism separating the microlenses and the photosensor is motorized and controlled via selection to match the needs of a particular exposure. For example, a user could choose high spatial resolution and put the camera on a tripod for a landscape photograph, and later choose maximal directional resolution to maximize the chance of accurately focusing an action shot in low light.

Figures 6A, 6B:
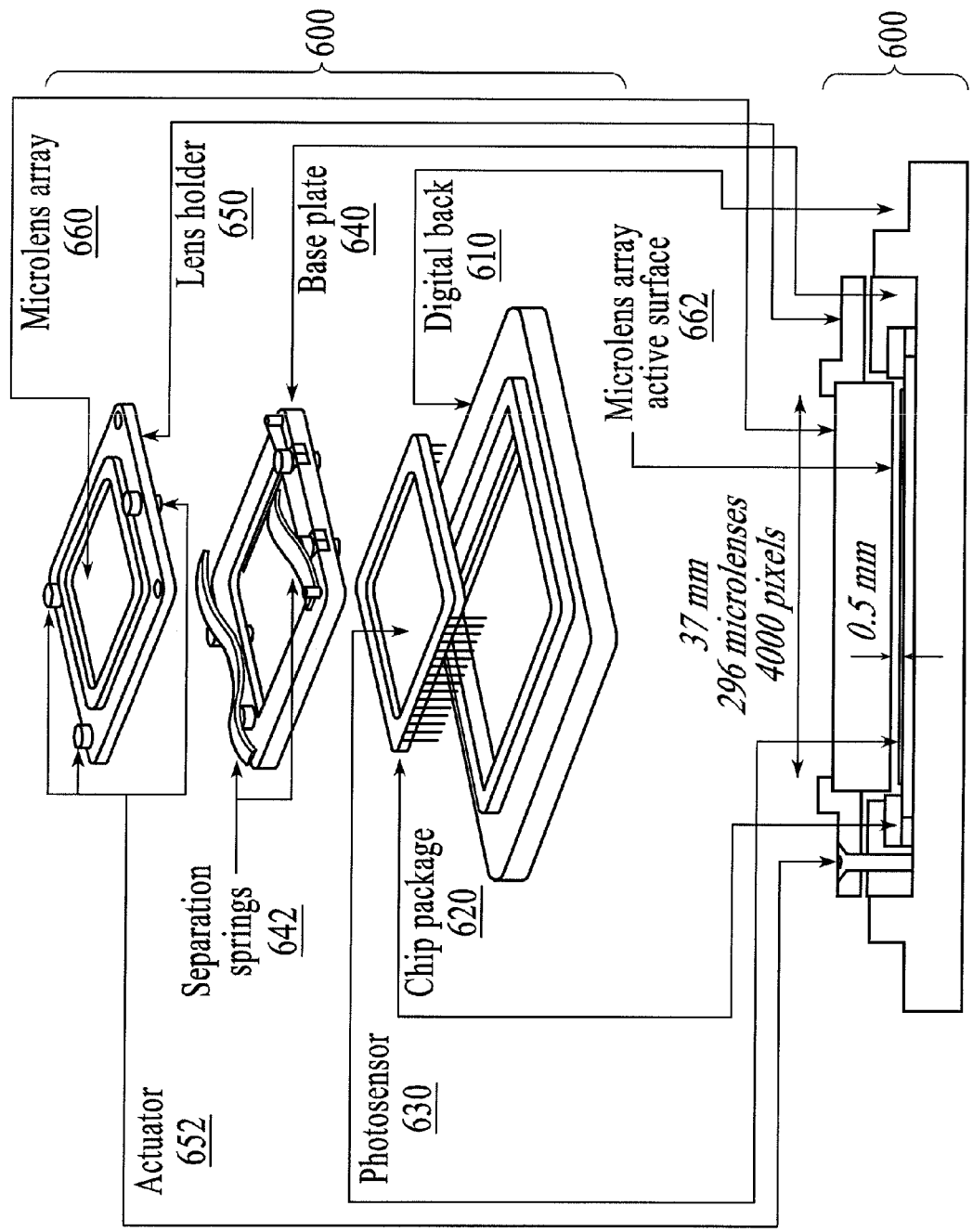
FIGS. 6A and 6B respectively show perspective and cross-sectional views of a microlens array and circuit arrangement for computing images, with a microlens-to-photosensor distance actuator, according to another example embodiment of the present invention.

FIGS. 6A and 6B respectively show perspective "exploded" and cross-sectional views of a microlens array and circuit arrangement 600 for computing images, with a microlens-to-photosensor distance actuator 652, according to another example embodiment of the present invention. The arrangement 600 may, for example, be implemented in a conventional camera, a specialized camera, a microscope arrangement or other video capture device.

Referring to the exploded view in FIG. 6A, the arrangement 600 includes a digital back 610 that supports a chip package 620 including a photosensor array 630. A base plate 640 mounts to the photosensor 630. A microlens array 660 held by a lens holder 650 is coupled to the base plate 640, with separation springs 642 separating the base plate and lens holder. An actuator arrangement 652, implemented in three locations, controls the relative positioning and separation of the microlens array 660 and the photosensor array 630.

In this example, the resolution of the photosensor array 630 is 4096×4096, and the resolution of the microlens array is 296×296 (providing about 14×14 sensor pixels under each microlens). The separation between an active surface 662 of the microlens array and the photosensor array 630 is shown at 0.5 mm by way of example, as positioned by the actuator arrangement 652.

The actuator arrangement 652 includes one or more of a variety of arrangements, and may be implemented with various arrangements (in position, type and otherwise) in replacement of that shown in FIGS. 6A and 6B. One application involves a screw-type fastener with threads that control the separation of the microlens array 660 and photosensor array 630, with the fastener adjusted manually and/or via mechanical actuation. Other arrangements include those similar to those used in other camera-type motors.

For general information regarding imaging approaches and for specific information regarding imaging approaches that may be selectively implemented in connection with one or more various example embodiments described herein, such as for focusing and/or correcting for lens aberration, reference may be made to PCT Patent Application No. PCT/US2005/035189, entitled "Imaging Arrangements and Methods Therefor," naming inventors Yi-Ren Ng, Patrick Hanrahan, Marc Levoy, and Mark Horowitz and filed on Sep. 30, 2005, which is fully incorporated herein by reference.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include implementing the various optical imaging applications and devices in different types of applications, increasing or decreasing the number of rays collected per pixel (or other selected image area), or implementing different algorithms and/or equations than the examples described to assemble or otherwise process image data. Other changes may involve using coordinate representations other than or in addition to Cartesian coordinates, such as polar coordinates, and/or using various other weighting and other schemes to facilitate the reduction or elimination of aberrations. Such modifications and changes do not depart from the true spirit and scope of the present invention.

What is claimed is:

1. A digital imaging system for capturing data usable for synthesizing an image of a scene, the system comprising:
   a main lens positioned to receive light from a scene to be digitally captured;
   a light ray sensor for sensing light from the scene as light rays of a light field, the light ray sensor comprising,
      a microlens array comprising a plurality of microlenses and positioned to receive light from the scene through the main lens and to capture microlens images beneath each of the plurality of microlenses; and
      a photosensor array comprising a plurality of photosensors, wherein the photosensor array is positioned to receive light from the microlens array, and in a first position is coincident with a focal plane of the microlens array such that the microlens images are in focus;
   an actuator configurable to set a distance between the photosensor array and the microlens array, wherein when the distance is shorter than the distance of the first position, the microlens images become defocused, and wherein each level of defocus provides a difference light field sampling pattern; and
   a processor configurable to provide image data characterizing a synthesized image as a function of the light from the light field sensed at different photosensors of the photosensor array, wherein the processor is configurable to provide image data characterizing a synthesized image as a function of the light from the light field sensed at different photosensors of the photosensor array, the set distance, and an angle of incidence of light from the light field on a two-dimensional focal plane of the main lens, and wherein the two-dimensional focal plane of the main lens coincides with a plane defined by the microlens array;
   wherein the microlens array, the photosensor array and the actuator comprise a common image sensor arrangement.

2. The system of claim 1, wherein the microlens array, the photosensor array and the actuator are on a common integrated circuit.

3. The system of claim 2, wherein the common integrated circuit comprises the processor.

4. The system of claim 1, wherein the photosensor array comprises a plurality of photosensors for each of the microlenses.

5. The system of claim 4, wherein the photosensor array further comprises an array of pixels in a plane defined by the microlens array on a side of the microlens array opposite the main lens.

6. The system of claim 1, wherein the light ray sensor is configurable such that light rays from a point on a subject in the scene converge at a point on a microlens of the microlens array, and wherein the microlens separates the light rays based on their direction, and wherein a focused image of an aperture of the main lens is created on a set of pixels in the array of pixels.

7. The system of claim 1, wherein the microlenses of the microlens array are at least two orders of magnitude smaller than a distance between the separation between the microlens array and the main lens.

8. The system of claim 1, wherein each level of defocus and different light field sampling pattern results in different levels of spatial and directional resolution in the captured digital image.

9. The system of claim 7, wherein when the photosensor array is located at approximately the focal plane of the microlens array, such that the microlens images are focused on the main lens, a relative maximal directional resolution and a relative minimal spatial resolution results.

10. The system of claim 5, further comprising a main lens actuator configurable to position the main lens with respect to the subject.

11. The system of claim 5, further comprising an image data processor to compute synthesized image data using the image data characterizing the synthesized image as a function of the light from the light fields sensed at different photosensors of the photosensor array.

12. The system of claim 10, wherein the synthesized image data comprises an output image of the scene in which at least a portion of the scene is refocused to have a focal point that is not on a two-dimensional focal plane of the main lens.

13. The system of claim 11, further comprising an autofocus sensor to detect a depth of a subject in the scene, wherein the actuator positions the photosensor array relative to the microlens array as a function of the depth of the subject, and wherein the image data processor is configurable to operate on the image data to generate an output image that is focused on the depth of the subject.

14. The system of claim 11, wherein computing the synthesized image data comprises anti-aliasing the output image, including combining light ray samples from multiple spatial locations.

* * * * *